United States Patent
Kudou et al.

(10) Patent No.: US 8,653,535 B2
(45) Date of Patent: Feb. 18, 2014

(54) SILICON CARBIDE SEMICONDUCTOR DEVICE HAVING A CONTACT REGION THAT INCLUDES A FIRST REGION AND A SECOND REGION, AND PROCESS FOR PRODUCTION THEREOF

(75) Inventors: Chiaki Kudou, Hyogo (JP); Masahiko Niwayama, Kyoto (JP); Ryo Ikegami, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/701,016

(22) PCT Filed: Aug. 29, 2011

(86) PCT No.: PCT/JP2011/004793
§ 371 (c)(1),
(2), (4) Date: Nov. 29, 2012

(87) PCT Pub. No.: WO2012/032735
PCT Pub. Date: Mar. 15, 2012

(65) Prior Publication Data
US 2013/0082285 A1    Apr. 4, 2013

(30) Foreign Application Priority Data

Sep. 6, 2010   (JP) .................................. 2010-198820

(51) Int. Cl.
*H01L 29/15* (2006.01)
(52) U.S. Cl.
USPC .............................. 257/77; 257/256; 438/186
(58) Field of Classification Search
CPC ... H01L 29/1608; H01L 29/16; H01L 29/205; H01L 29/225; H01L 29/267; H01L 29/66477; H01L 29/66893; H01L 29/7832

USPC ................. 257/77, 256, 287, E29.084, E21.4, 257/E21.403; 438/186, 301
See application file for complete search history.

(56) References Cited

U.S. PATENT DOCUMENTS 5,930,630 A * 7/1999 Hshieh et al. ................. 438/268
5,976,936 A   11/1999 Miyajima et al.
(Continued)

FOREIGN PATENT DOCUMENTS

JP   06-084824 A    3/1994
JP   10-308510 A   11/1998
(Continued)

OTHER PUBLICATIONS

International Search Report for corresponding International Application No. PCT/JP2011/004793 mailed Nov. 22, 2011.
(Continued)

*Primary Examiner* — Khiem D Nguyen
(74) *Attorney, Agent, or Firm* — Renner, Otto, Boiselle & Sklar, LLP

(57) ABSTRACT

A semiconductor device according to the present invention includes a contact region 201 of a second conductivity type which is provided in a body region 104. The contact region 201 includes a first region 201a in contact with a first ohmic electrode 122 and a second region 201b located at a position deeper than that of the first region 201a and in contact with the body region 104. The first region 201a and the second region 201b each have at least one peak of impurity concentration. The peak of impurity concentration in the first region 201a has a higher value than that of the peak of impurity concentration in the second region 201b.

15 Claims, 12 Drawing Sheets

(56) References Cited

U.S. PATENT DOCUMENTS

| | | |
|---|---|---|
| 2001/0046757 A1 | 11/2001 | Takahashi et al. |
| 2003/0020136 A1 | 1/2003 | Kitabatake et al. |
| 2004/0217375 A1 | 11/2004 | Yokogawa et al. |
| 2005/0001217 A1 | 1/2005 | Kusumoto et al. |
| 2006/0270202 A1 | 11/2006 | Wirbeleit et al. |
| 2007/0158658 A1* | 7/2007 | Ryu ............................ 257/77 |
| 2008/0272408 A1* | 11/2008 | Vora ............................ 257/272 |
| 2010/0078650 A1 | 4/2010 | Hatakeyama et al. |
| 2010/0207125 A1 | 8/2010 | Uchida et al. |

FOREIGN PATENT DOCUMENTS

| | | |
|---|---|---|
| JP | 11-307545 A | 11/1999 |
| JP | 2001-332508 A | 11/2001 |
| JP | 3527496 B | 2/2004 |
| JP | 2005-039257 A | 2/2005 |
| JP | 2005-303010 A | 10/2005 |
| JP | 3773489 B | 2/2006 |
| JP | 3784393 B | 3/2006 |
| JP | 2008-543082 T | 11/2008 |
| JP | 2009-266871 A | 11/2009 |
| JP | 2009-277839 A | 11/2009 |
| WO | 2009/054140 A1 | 4/2009 |

OTHER PUBLICATIONS

International Preliminary Report on Patentability for corresponding International Application No. PCT/JP2011/004793 dated Jun. 26, 2012.

Yamashita et al., "Normally-off 4H-SiC Power MOSFET with Submicron Gate", Materials Science Forum, vols. 600-603 (2009) pp. 1115-1118, Trans Tech Publications, Switzerland.

* cited by examiner

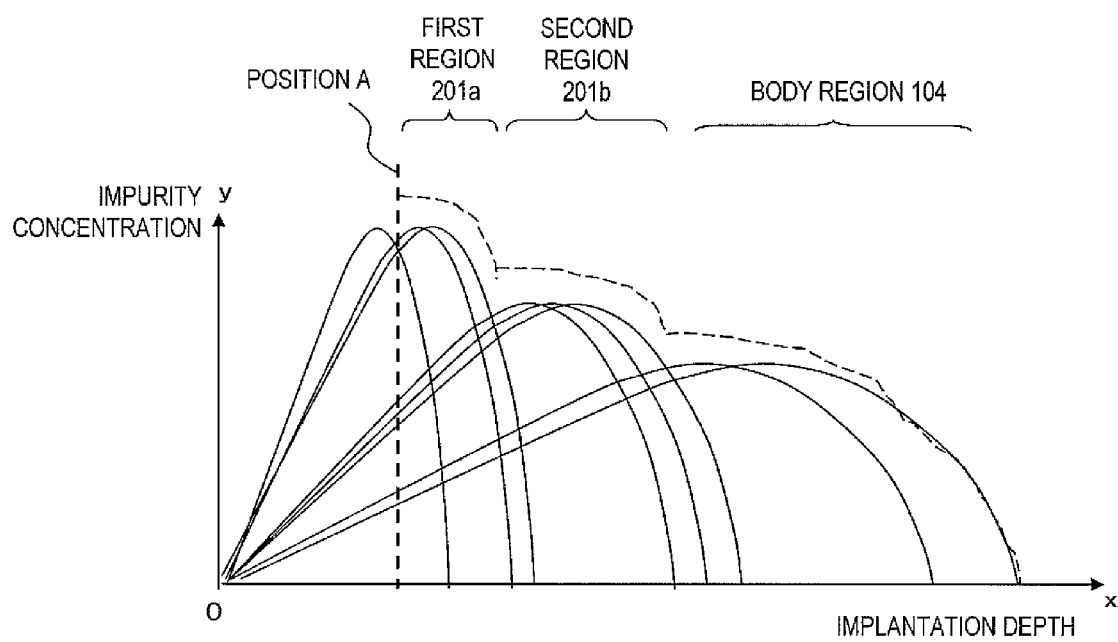

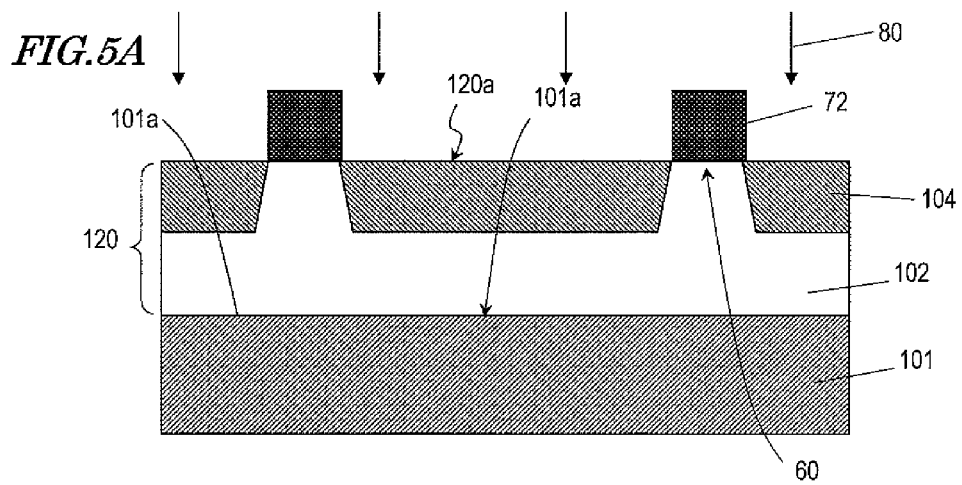
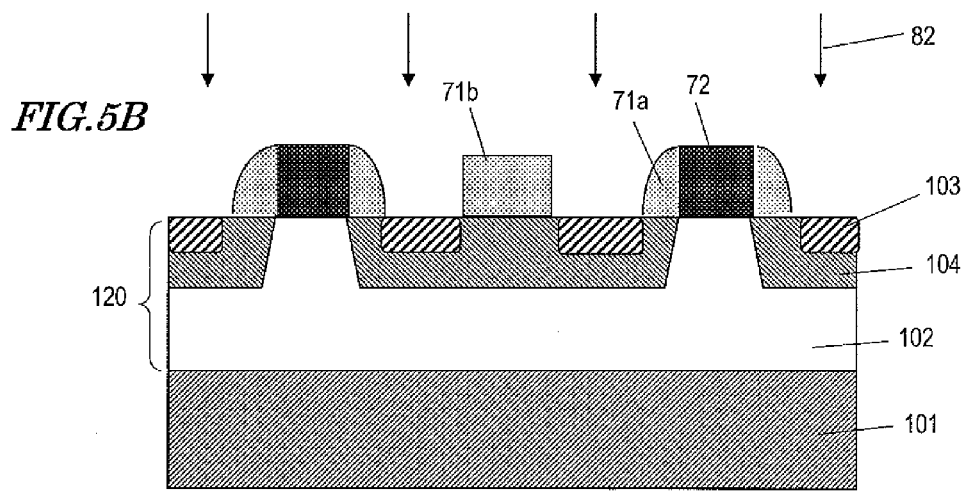
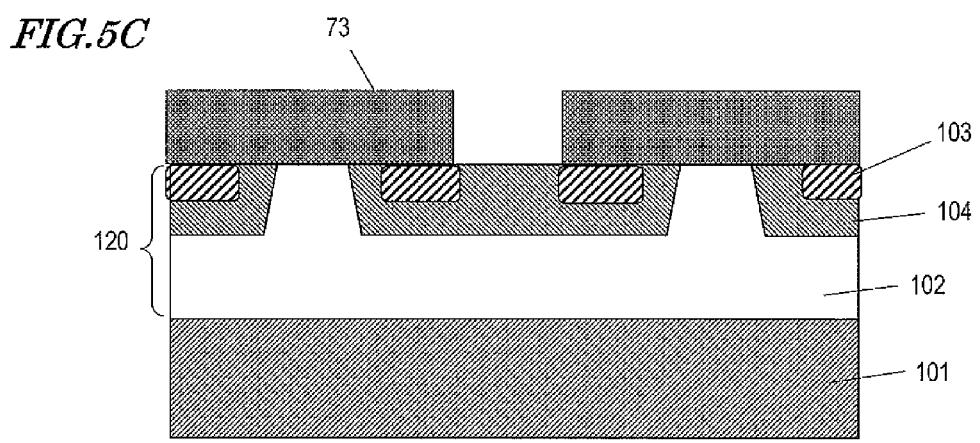

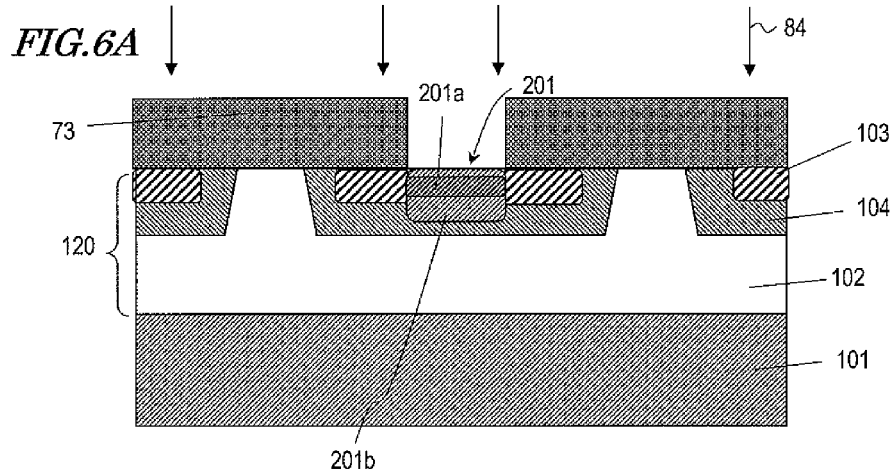
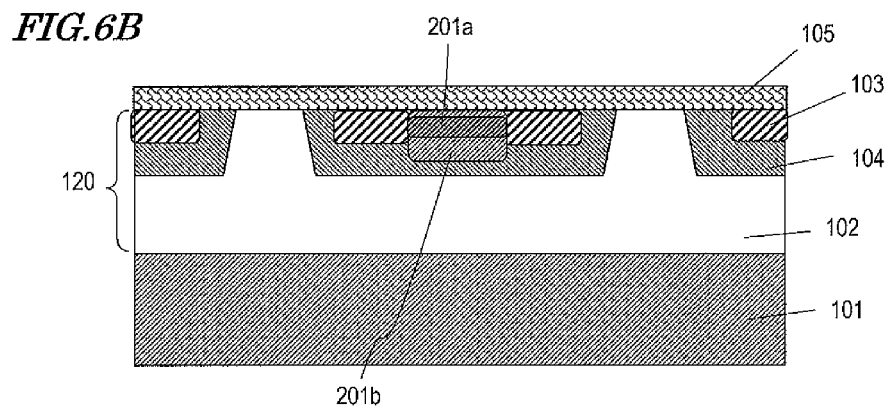
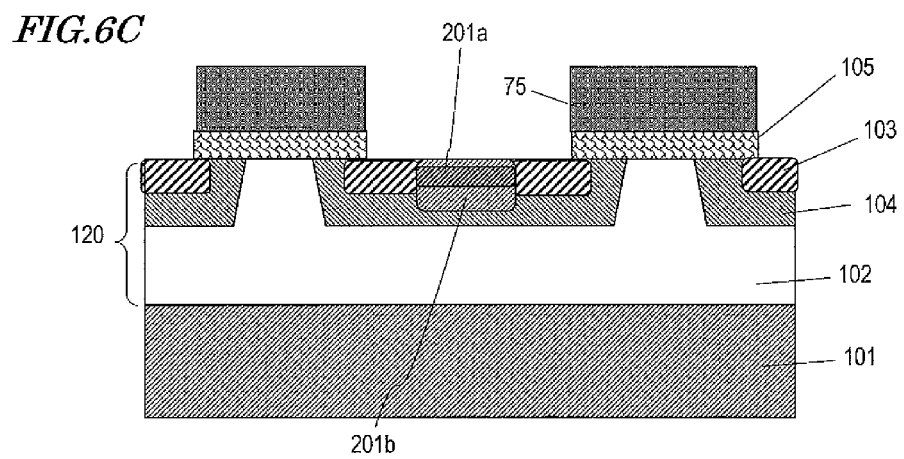

Conventional Art

SILICON CARBIDE SEMICONDUCTOR DEVICE HAVING A CONTACT REGION THAT INCLUDES A FIRST REGION AND A SECOND REGION, AND PROCESS FOR PRODUCTION THEREOF

TECHNICAL FIELD

The present invention relates to a semiconductor device and a method for producing the same, and in particular to a silicon carbide power semiconductor device.

BACKGROUND ART

A power semiconductor device is a semiconductor device usable for causing a large electric current to flow at a high withstand voltage, and is desired to be low in loss. Recently, a power semiconductor device is used for a high rate inverter. For such a use, the semiconductor device is also required to be operable at high speed.

A power semiconductor device is conventionally produced by use of a silicon (Si) substrate. However, recently, a power semiconductor device using a silicon carbide (SiC) substrate attracts attention, and is being developed progressively (see, for example, Patent Documents 1 through 4, etc.).

A breakdown voltage of silicon carbide itself as a material is higher by one digit than that of silicon. Therefore, in the case where a power semiconductor device is produced by use of silicon carbide, even when a depletion layer at a p-n junction or a Schottky junction is thinned, the reverse voltage can be maintained. Accordingly, by decreasing the thickness of the device and increasing the doping concentration of the silicon carbide layer, a power semiconductor device having a low ON resistance, a high withstand voltage and a low loss can be realized. Silicon carbide has a saturated electron velocity which is about twice that of silicon, and therefore can realize a high rate operation.

Hereinafter, a conventional silicon carbide power semiconductor device will be described.

A silicon carbide semiconductor device 1000 shown in FIG. 11 is an n-type planar vertical-type metal-insulator-semiconductor field effect transistor (hereinafter, referred to simply as a "MISFET"). The silicon carbide semiconductor device 1000 includes a semiconductor substrate 101 formed of $n^+$-type SiC. On a main surface of the semiconductor substrate 101, an $n^-$-type first epitaxial layer 120 formed of silicon carbide is provided. In a prescribed region of a surface portion of the first epitaxial layer 120, a p-type body region (well region) 104 having a prescribed depth is provided. A region of the first epitaxial layer 120 other than the body region 104 is a drift region 102. In the vicinity of a surface of the body region 104, an $n^+$-type impurity region (source region) 103 is provided. In the body region 104, a contact region 201 is provided. Generally in order to decrease the contact resistance at a surface of the contact region 201 and in order to decrease the resistance of the contact region 201 itself, the contact region 201 has an impurity profile having a substantially uniform concentration from a surface thereof. Such an impurity profile is referred to as a "box profile". A second epitaxial layer 105 for connecting the impurity region 103 and the drift region 102 is located so as to cover a surface portion of the body region 104. On a surface of the second epitaxial layer 105, a gate electrode 108 is provided while a gate insulating film 107 is interposed between the second epitaxial layer 105 and the gate electrode 108.

On the surface of the first epitaxial layer 120, an interlayer insulating film 109 is provided so as to cover the gate electrode 108. The interlayer insulating layer 109 has a contact hole for exposing the impurity region 103 and the contact region 201. In the contact hole, a first ohmic electrode (source electrode) 122 is provided, and also a wiring line 110 is provided. A contact hole for exposing the gate electrode 108 is also provided in the interlayer insulating film 109. In this contact hole, a wiring line 112 is provided. Between the wiring line 112 and the gate electrode 108, a metal silicide layer 123 is provided. On a rear surface of the semiconductor substrate 101, a second ohmic electrode (drain electrode) 111 is provided.

In the semiconductor device 1000 shown in FIG. 11, a voltage is applied between the first ohmic electrode 122 and the gate electrode 108 to give an electric field to the gate insulating film 107. As a result, an accumulation type channel 41 is excited in the second epitaxial layer 105, and carriers flow between the first ohmic electrode 122 and the second ohmic electrode 111.

The contact region 201 is formed by, for example, implanting aluminum ion into the first epitaxial layer 120. In silicon carbide, aluminum ion, which is a p-type impurity, is not thermally diffused almost at all. Therefore, the contact region 201 shown in FIG. 11 is formed by a method by which ion implantation is performed a plurality of times at different implantation energy levels, so that the distribution of the impurity concentration in a depth direction is made almost uniform (box profile).

Meanwhile, Patent Document 5 discloses a method by which hydrogen etching or the like is performed after implantation of impurities in order to decrease the contact resistance, so that a peak of the impurity concentration is located in the vicinity of a surface of silicon carbide.

CITATION LIST

Patent Literature

Patent Document 1: Japanese Laid-Open Patent Publication No. 10-308510
Patent Document 2: Japanese Patent No. 3773489
Patent Document 3: Japanese Patent No. 3784393
Patent Document 4: Japanese Patent No. 3527496
Patent Document 5: Japanese Laid-Open Patent Publication No. 2001-332508

SUMMARY OF INVENTION

Technical Problem

The contact region 201 plays a role of equalizing the potential of the body region 104 to the potential of the first ohmic electrode 122. Since the contact region 201 needs to have a sufficient conductivity, it is more preferable that the impurity concentration of the contact region 201 is higher. Therefore, the contact region 201 is provided such that impurities are contained therein at a uniform and high concentration in a depth direction and such that a bottom surface thereof contacts the body region 104.

In general, impurities are not easily diffused in a silicon carbide layer. Therefore, ion implantation is performed in multiple stages at different implantation energy levels, so that an impurity profile which is uniform in the depth direction of the contact region 201 is formed. However, this involves problems that formation of the contact region 201 is time-consuming and that the load on an ion implantation apparatus is large.

In addition, it is usually more difficult to form a good ohmic contact to p-type silicon carbide than to n-type silicon carbide. A main reason for this is that a barrier formed between a main ohmic metal and p-type silicon carbide is higher than a barrier formed between an ohmic metal and n-type silicon carbide. In order to form a good ohmic contact to p-type silicon carbide, the ohmic metal needs to be implanted into p-type silicon carbide at a higher concentration. However, there is a limit on the solid-solubilization of impurities to silicon carbide. In addition, when an annealing temperature is raised in order to enhance the diffusion of the ohmic metal, the possibility that the wafer is warped is increased. Furthermore, the present inventors newly revealed that annealing causes problems that SiC, for example, vaporizes or vanishes.

In the case where the contact resistance between the first ohmic electrode 122 and the body region 104 cannot be decreased in the semiconductor device 1000 for the above-described reasons or the like, the following inconveniences occur. Hereinafter, the results of studies made by the present inventors will be described.

In the semiconductor device 1000 shown in FIG. 11, when a voltage equal to or lower than a threshold value (Vth) (e.g., 0 V) is applied between the first ohmic electrode 122 and the gate electrode 108 (OFF state), depletion layers extending from both of two ends of the body region 104 are connected to each other in a JFET (Junction Field-Effect Transistor) region 60. In order to transfer this OFF state into an ON state at high speed, the depletion layers in the JFET region 60 needs to be reduced in size and an electric current path needs to be formed in the JFET region 60 instantaneously when a voltage is applied between the first ohmic electrode 122 and the gate electrode 108.

However, when the contact resistance to the body region 104 is large, the potential is transferred to the end of the body region 104 slowly and thus the depletion layers are reduced in size slowly. Therefore, it takes time until the semiconductor device 1000 is put into the ON state completely. Specifically, as shown in FIG. 12A, the semiconductor device 1000 has a structure equivalent to a structure having a parasitic transistor T1 in which a region of the body region 104 which is held between the impurity region 103 and the JFET region 60 is used as a gate. As a result, the time required for switching the transistor T1 delays switching of the semiconductor device 1000.

By contrast, when, as shown in FIG. 12B, a voltage equal to or higher than the threshold value (Vth) (e.g., 20 V) is applied between the first ohmic electrode 122 and the gate electrode 108 (ON state), an accumulation type channel 41 is formed in the second epitaxial layer 105 via the gate insulating film 107, and electrons flow into the accumulation type channel 41. In this step, electrons accumulated in the depletion layer formed between the body region 104 and the drift region 102 are also used. As a result, the potential of the body region 104 becomes close to the source potential, and the depletion layer is reduced in size. Thus, an electric current path is formed in the JFET region 60, and the semiconductor device 1000 is put into the ON state.

In this case, the value of an external resistance is selected such that the drain voltage becomes about 1 V to 2 V by a voltage drop of the external resistance. In the case where the transistor is turned OFF, the source voltage and the body (well) voltage both become 0 V, and the drain voltage becomes approximately 0 V to 2 V.

However, when the contact resistance to the body region 104 is large, the potential is transferred to the end of the body region 104 slowly, and the potential of the body region 104 is raised by about 2.7 V. As a result, a parasitic bipolar transistor T2 formed among the source, the body region (well region) and the drain is turned ON, and thus the electric current flows from the drain toward the source. Therefore, it takes time until the semiconductor device 1000 is put into the ON state completely.

By the method described in Patent Document 5, it is still difficult to obtain an ohmic contact of a low resistance with a contact metal. The studies made by the present inventors found that this occurs because the surface of silicon carbide is further retracted after hydrogen etching or the like is performed in order to locate an impurity concentration peak in the vicinity of the surface of silicon carbide. Specifically, silicon carbide vanishes when annealing is performed in order to activate the impurities after the hydrogen etching or the like is performed, and silicon carbide is consumed in the step of silicidation of the contact metal. Nonetheless, Patent Document 5 does not consider such steps.

The present invention made in light of such problems has an object of providing a semiconductor device operable at high speed, which can decrease the value of contact resistance to the body region and also can shorten the time of ion implantation.

Solution to Problem

A semiconductor device according to the present invention includes a semiconductor substrate of a first conductivity type which has a main surface and a rear surface and contains silicon carbide; a first epitaxial layer of the first conductivity type which is provided on the main surface of the semiconductor substrate and contains silicon carbide; a body region of a second conductivity type which is provided in the first epitaxial layer; an impurity region of the first conductivity type which is provided in contact with the body region; a contact region of the second conductivity type which is provided in the body region; a first ohmic electrode in contact with the contact region; a gate insulating film provided above at least a part of the body region; and a gate electrode provided on the gate insulating film. The contact region includes a first region in contact with the first ohmic electrode and a second region located at a position deeper than that of the first region and in contact with the body region; the first region and the second region each have at least one peak of impurity concentration in a depth direction; the at least one peak of impurity concentration in the first region has a higher value than that of the at least one peak of impurity concentration in the second region; and a bottom surface of the second region is deeper than a bottom surface of the impurity region and is shallower than a bottom surface of the body region.

In an embodiment, the value of the at least one peak in the first region is $6 \times 10^{20}$ cm$^{-3}$ or greater and $2 \times 10^{21}$ cm$^{-3}$ or less.

In an embodiment, the value of the at least one peak in the second region is $5 \times 10^{19}$ cm$^{-3}$ or greater and $2 \times 10^{21}$ cm$^{-3}$ or less.

In an embodiment, the value of the at least one peak in the second region is 1/5 or less of the value of at least one peak in the first region.

In an embodiment, the impurity concentration of the second conductivity type in the contact region is highest at an interface thereof contacting the first ohmic electrode.

In an embodiment, a region of the first epitaxial layer other than the body region is a drift region; and the gate insulating film is provided above at least a part of a region, of the body region, which is located between the impurity region and the drift region.

In an embodiment, the semiconductor device further includes a second epitaxial layer containing silicon carbide and provided between the gate insulating film and at least the part of the region, of the body region, which is located between the impurity region and the drift region.

In an embodiment, at least the part of the region, of the body region, which is located between the impurity region and the drift region is in contact with the gate insulating film.

In an embodiment, the first ohmic electrode contains nickel silicide or titanium silicide.

In an embodiment, the impurity region surrounds the contact region at an arbitrary depth in the body region.

A method for producing a semiconductor device according to the present invention includes step (a) of using a semiconductor substrate of a first conductivity type which has a main surface and a rear surface and contains silicon carbide, thereby forming a first epitaxial layer of the first conductivity type which contains silicon carbide on a main surface of the semiconductor substrate; step (b) of forming a body region of a second conductivity type in the first epitaxial layer; step (c) of forming an impurity region of the first conductivity type in contact with the body region; step (d) of forming a contact region of the second conductivity type in the body region; step (e) of forming a first ohmic electrode on a main surface of the impurity region; step (f) of forming a gate insulating film above at least a part of the body region; step (g) of forming a gate electrode on the gate insulating film; and step (h) of forming a second ohmic electrode on the rear surface of the semiconductor substrate. The step (d) includes step (d1) of performing ion implantation at least once, thereby forming a first region, and step (d2) of performing ion implantation at least once at a higher energy level than the ion implantation performed in the step (d1), thereby forming a second region; the first region and the second region each have at least one peak of impurity concentration in a depth direction; the at least one impurity concentration in the first region has a higher value than that of the at least one peak of impurity concentration in the second region; the second region is in contact with the body region, and a bottom surface of the second region is deeper than a bottom surface of the impurity region and is shallower than a bottom surface of the body region; and in the step (e), the first ohmic electrode is formed so as to be in contact with the first region.

In an embodiment, in the step (d1), the ion implantation is performed at least once under conditions of 70 keV or greater and 100 keV or less and $3.6 \times 10^{15}$ cm$^{-2}$ or greater and $6 \times 10^{16}$ cm$^{-2}$ or less.

In an embodiment, in the step (d1), the ion implantation is performed at least once under a condition of $7.2 \times 10^{15}$ cm$^{-2}$ or greater.

In an embodiment, in the step (d2), the ion implantation is performed at least once under conditions of 150 keV or greater and 200 keV or less and $2.8 \times 10^{15}$ cm$^{-2}$ or greater and $5 \times 10^{16}$ cm$^{-2}$ or less.

In an embodiment, in the step (d1), the ion implantation is performed with an implantation range which is substantially the same as a thickness of the first ohmic electrode which is to be formed in the step (e).

Advantageous Effects of Invention

According to the present invention, in the first region of the contact region which is located at a position contacting the first ohmic electrode, a good ohmic contact with the contact metal can be obtained. Owing to this, the contact resistance to the body region can be decreased. Therefore, a semiconductor device which suppresses the delay of the switching operation and is operable at high speed can be provided.

The value of the impurity concentration peak in the second region of the contact region which is located at a position deeper than that of the first region is made smaller than the value of the impurity concentration peak in the first region. Thus, time required for ion implantation can be shortened. Owing to this, the load on the ion implantation apparatus can be alleviated, and the mass productivity can be improved.

BRIEF DESCRIPTION OF DRAWINGS

FIG. 4 is a graph schematically showing impurity profiles in a first region 201a, a second region 201b and the body region 104.

FIG. 5A is a cross-sectional view showing a production step of the semiconductor device shown in FIG. 1A.

FIG. 5B is a cross-sectional view showing a production step of the semiconductor device shown in FIG. 1A.

FIG. 5C is a cross-sectional view showing a production step of the semiconductor device shown in FIG. 1A.

FIG. 6A is a cross-sectional view showing a production step of the semiconductor device shown in FIG. 1A.

FIG. 6B is a cross-sectional view showing a production step of the semiconductor device shown in FIG. 1A.

FIG. 6C is a cross-sectional view showing a production step of the semiconductor device shown in FIG. 1A.

DESCRIPTION OF EMBODIMENTS

Hereinafter, embodiments of the present invention will be described with reference to the figures. In the following figures, elements having substantially the same functions as those of the conventional semiconductor devices bear the same reference signs. The present invention is not limited to the following embodiments. The first conductivity type may be either n type or p type, and in this case, the second conductivity type may be p type or n type.

Figure 1A:
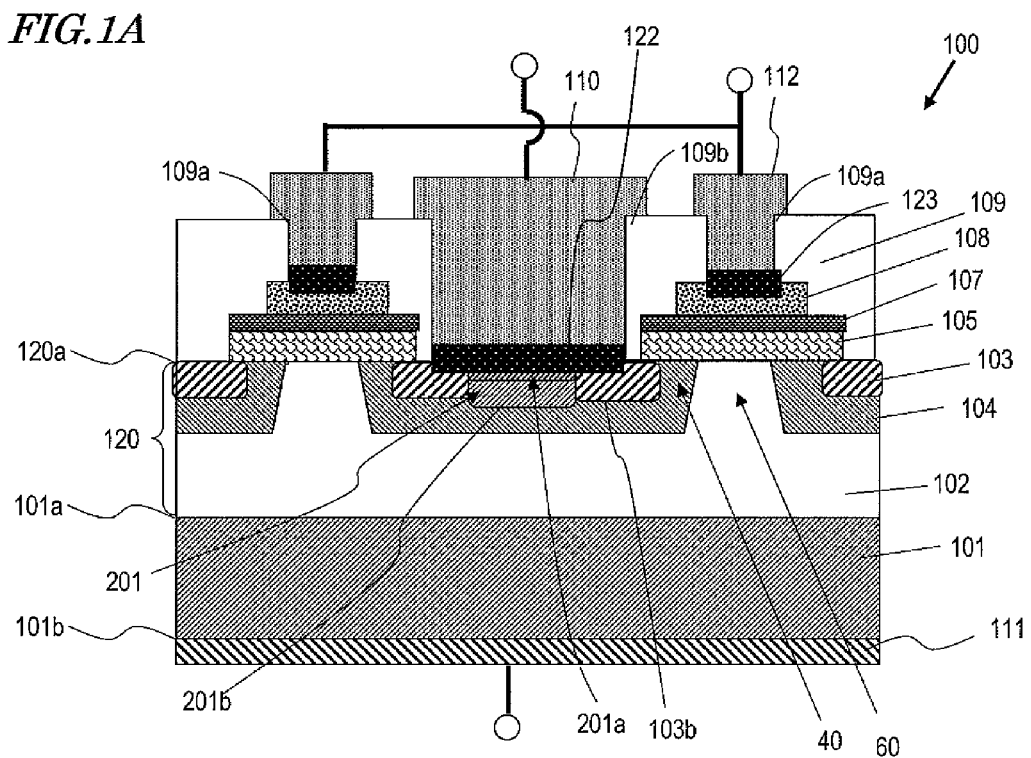
FIG. 1A is a cross-sectional view schematically showing a semiconductor device in an embodiment according to the present invention.

FIG. 1A schematically shows a cross-sectional structure of a semiconductor device 100, which is an embodiment of a semiconductor device according to the present invention. The semiconductor device 100 includes a semiconductor substrate 101 of a first conductivity type which has a main surface 101a and a rear surface 101b and contains silicon carbide. On the main surface 101a of the semiconductor substrate 101, a first epitaxial layer 120 of the first conductivity type which has an impurity concentration lower than that of the semiconductor substrate 101 and is formed of silicon carbide is provided. In the first epitaxial layer 120, a body region 104 of a second conductivity type is provided. In the body region 104, an impurity region 103 of the first conductivity type is provided. The impurity region 103 of the first conductivity type has an impurity concentration higher than that of the semiconductor substrate 101. A region of the first epitaxial layer 120 other than the body region 104 is a drift region 102. Therefore, the drift region 102 has an impurity concentration lower than that of the semiconductor substrate 101.

More specifically, the body region 104 is provided in a region from a top surface 120a of the first epitaxial layer 120 to a prescribed depth, and the impurity region 103 is provided in the body region 104 from the top surface 120a to a prescribed depth. A bottom portion (bottom surface) 103a of the impurity region 103 is shallower than the position of a bottom portion of the body region 104, and thus the impurity region 103 does not protrude from the body region 104. The body region 104 and the impurity region 103 are exposed at the top surface 120a of the first epitaxial region 120.

Figure 1B:
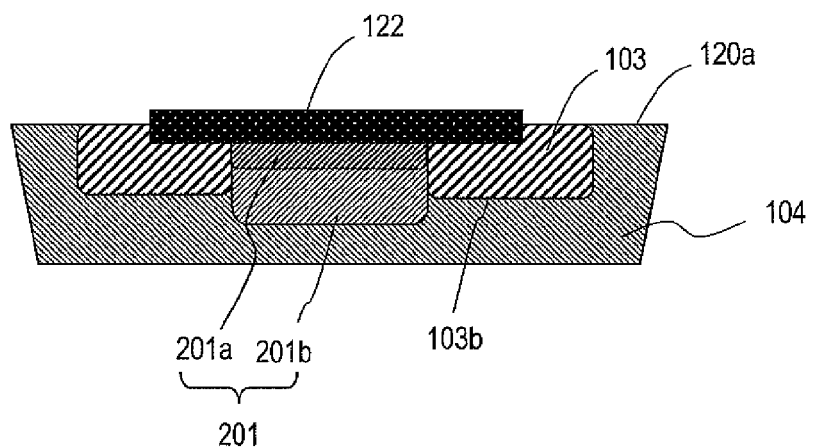
FIG. 1B is a cross-sectional view showing a body region 104 shown in FIG. 1A in enlargement.

FIG. 1B is an enlarged cross-sectional view of the body region 104. As shown in FIG. 1B, in the body region 104, a contact region 201 of the second conductivity type is provided. The contact region 201 is divided into a first region 201a in contact with a first ohmic electrode 122 and a second region 201b located at a position deeper than that of the first region 201a and in contact with the body region 104. A bottom surface of the second region 201b is deeper than the bottom surface 103b of the impurity region 103 and shallower than a bottom surface of the body region 104. Namely, the contact region 201 does not run through the body region 104, and the bottom surface of the second region 201b is covered with the body region 104.

Figure 1C:
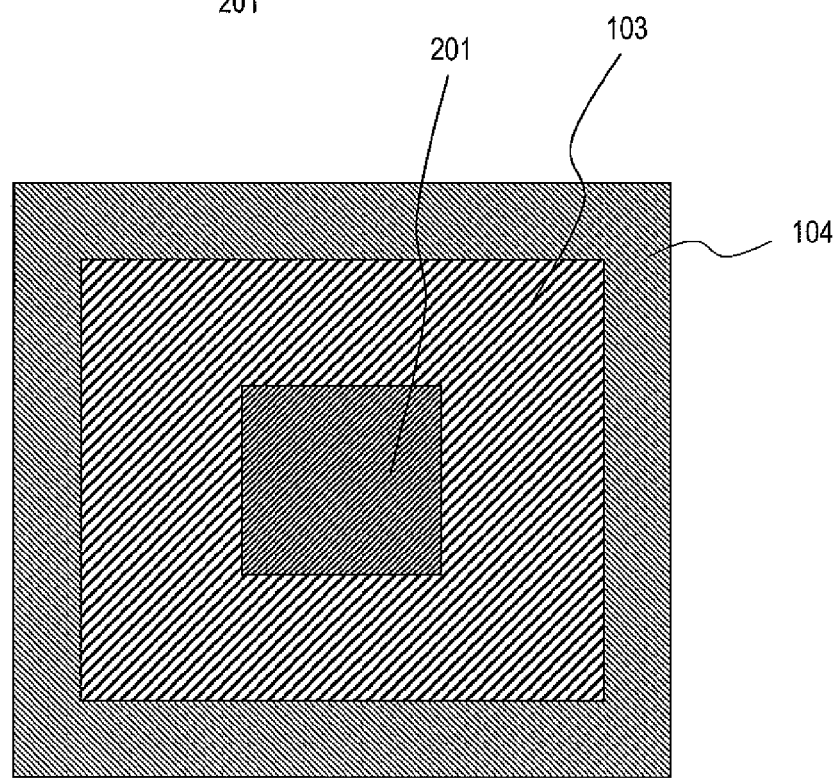
FIG. 1C is a plan view showing the body region 104 shown in FIG. 1A in enlargement.

FIG. 1C is a plan view of the body region 104. As shown in FIG. 1C, as seen in a plan view, the impurity region 103 is provided in the body region 104, and the contact region 201 is provided in the impurity region 103.

If the contact region 201 runs through the body region 104, a p-n junction is formed between the contact region 201 having a higher concentration of second conductivity type impurities than that of the body region 104 and the drift region 102. As the concentration of the second conductivity type impurities in a region where a p-n junction is formed is higher, a junction leak current is more likely to be generated. In this embodiment, the contact region 201 (second region 201b) is not in contact with the drift region 102, and thus a p-n junction is formed between the body region 104 and the drift region 102. Therefore, in this embodiment, a contact area size of the body region 104 and the contact region 201 can be increased while the generation of the junction leak current is suppressed. Thus, the body contact resistance (resistance value between the body region 104 and the contact region 201) can be decreased while the junction leak current is suppressed.

In FIG. 1A through FIG. 1C, the impurity region 103 and the contact region 201 are shown as being in contact with each other. Alternatively, the impurity region 103 and the contact region 201 may be located discretely.

The first ohmic electrode 122 is provided so as to be in contact with at least a part of the first region 201a.

Figure 2:
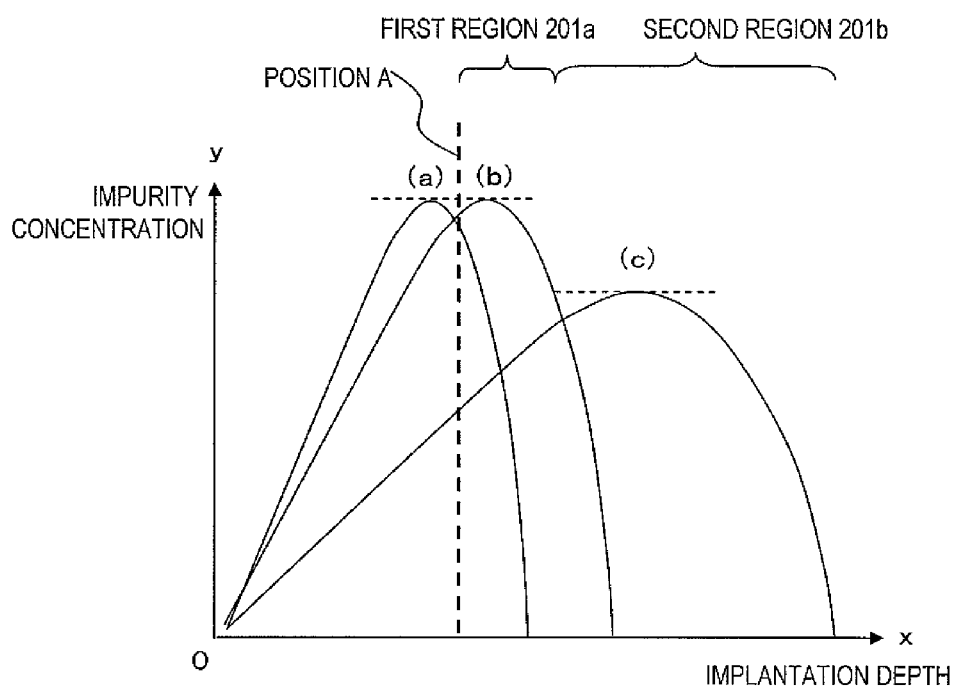
FIG. 2 is a graph schematically showing impurity profiles in a contact region 201.

FIG. 2 is a graph schematically showing impurity profiles in the contact region 201. The graph shown in FIG. 2 shows three impurity profiles (a) through (c) which are labeled in an order from the impurity profile having the smallest implantation depth. For example, the impurities of the profile (a) are implanted at an energy level of 30 keV, the impurities of the profile (b) are implanted at an energy level of 70 keV, and the impurities of the profile (c) are implanted at an energy level of 150 keV.

In the graph shown in FIG. 2, impurity concentration peaks of the profiles (a) and (b) have an approximately equal value to each other.

In an actual production process of a semiconductor device, after ion implantation of impurities is performed for forming the contact region 201, an anneal step, a silicidation step, and an etching step are performed. As a result, a region from a surface of the contact region 201 to a prescribed depth may vanish and thus the surface of the contact region 201 may retract. In the graph of FIG. 2, the position at which the value of the horizontal axis is zero corresponds to the position of the surface of the contact region 201 before retracting. The surface of the contact region 201 retracts to, for example, position A in the graph. When the surface of the contact region 201 retracts to position A, the peak of the impurity profile (a) is not existent in the contact region 201. In the first region 201a of the contact region 201, the peak of the impurity profile (b) is existent; and in the second region 201b of the contact region 201, the peak of the impurity profile (c) is existent.

As shown in the graph of FIG. 2, in this embodiment, the peak of the impurity profile in the first region 201a (profile (b)) has a higher value than that of the peak of the impurity profile in the second region 201b (profile (c)).

In this embodiment, in the case where implantation is performed a plurality of times with the same energy level, a plurality of profiles having a peak at the same depth are formed. In this case, the plurality of profiles having the peak at the same depth do not need to have an equal impurity concentration to each other. For example, in the case where there are a plurality of profiles (b) and a plurality of profiles (a), it is preferable that each of the peaks of the profiles (b) is higher than each of the peaks of the profiles (c).

The contact region 201 does not need to retract to position A. The contact region 201 may not retract, may retract a position shallower than position A, or may retract a position deeper than position A. Nonetheless, it is preferable that the contact region 201 retracts to a position which is deeper than the peak position of the impurity profile (a) existent at the shallowest position in the first region 201a and shallower than the peak position of the impurity profile (c) existent at the deepest position in the first region 201a. In this case, even when the amount of retraction varies in the actual production process, the impurity concentration of the surface can be made approximately uniform. Therefore, the contact resistance can be suppressed from varying.

It is preferable that the concentration of the second conductivity type impurities in the first region 201a is highest at an interface thereof contacting the first ohmic electrode 122.

Figure 3:
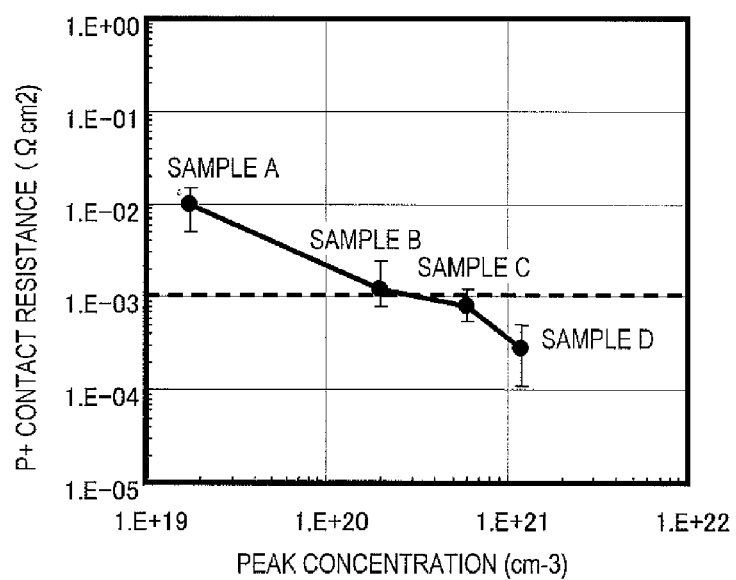
FIG. 3 is a graph showing the relationship between the peak concentration and the contact resistance in the contact region, in which "1. E-01" means "$1 \times 10^{-1}$" and "1. E-02" means "$1 \times 10^{-2}$", namely, "1. E+X" means "$1 \times 10^{X}$".

FIG. 3 shows measurement results of the relationship between the peak concentration at the interface of the first region 201a in the contact region and the contact resistance between the first region 201a and the first ohmic electrode. The contact resistance was measured by a Kelvin pattern.

As samples for the measurement, four types of samples A, B, C and D respectively having peak concentrations of impurities in the contact region of $1.8 \times 10^{19}$ cm$^{-3}$, $2 \times 10^{20}$ cm$^{-3}$, $6 \times 10^{20}$ cm$^{-3}$ and $1.2 \times 10^{21}$ cm$^{-3}$ were formed. On each of samples A, B, C and D, ion implantation was performed at three energy level of 30 keV, 70 keV and 150 keV.

For forming sample A (peak concentration: $1.8 \times 10^{19}$ cm$^{-3}$), the implantation amount at the implantation energy level of 30 keV was $1.5 \times 10^{14}$ cm$^{-2}$, the implantation amount at the implantation energy level of 70 keV was $3.5 \times 10^{14}$ cm$^{-2}$, and the implantation amount at the implantation energy level of 150 keV was $8.3 \times 10^{14}$ cm$^{-2}$.

For forming sample B (peak concentration: $2 \times 10^{20}$ cm$^{-3}$), the implantation amount at the implantation energy level of 30 keV was $5.5 \times 10^{14}$ cm$^{-2}$, the implantation amount at the implantation energy level of 70 keV was $1.2 \times 10^{15}$ cm$^{-2}$, and the implantation amount at the implantation energy level of 150 keV was $5.5 \times 10^{14}$ cm$^{-2}$.

For forming sample C (peak concentration: $6 \times 10^{20}$ cm$^{-3}$, the implantation amount at the implantation energy level of 30 keV was $1.65 \times 10^{14}$ cm$^{-2}$, the implantation amount at the implantation energy level of 70 keV was $3.6 \times 10^{15}$ cm$^{-2}$, and the implantation amount at the implantation energy level of 150 keV was $8.4 \times 10^{14}$ cm$^{-2}$.

For forming sample D (peak concentration: $1.2 \times 10^{21}$ cm$^{-3}$), the implantation amount at the implantation energy level of 30 keV was $3.3 \times 10^{15}$ cm$^{-2}$, the implantation amount at the implantation energy level of 70 keV was $7.2 \times 10^{15}$ cm$^{-2}$, and the implantation amount at the implantation energy level of 150 keV was $1.68 \times 10^{16}$ cm$^{-2}$. Ion implantation was performed in multiple stages under different conditions of implantation energy to each of samples A through D. As a result, there are a plurality of impurity profiles having different peaks in each of samples A through D. As a result of performing ion implantation under the above-described conditions, the impurity concentrations of the peaks of the plurality of impurity profiles have an approximately equal value in each of samples A through D.

As shown in FIG. 3, in sample B (peak concentration: $2 \times 10^{20}$ cm$^{-3}$), the contact resistance is slightly lower than the target value of $1 \times 10^{-3}$ Ωcm$^2$. In sample C (peak concentration: $6 \times 10^{20}$ cm$^{-3}$), the contact resistance of a majority of measurement points in a wafer are below the target value. It is seen that in sample D (peak concentration: $1.2 \times 10^{21}$ cm$^{-3}$), the contact resistance of all the measurement points in a wafer is below the target value.

In this embodiment, the first region 201a of the contact region 201 is in contact with the first ohmic electrode 122. In the first region 201a, a part contacting the first ohmic electrode 122 has an impurity concentration of $6 \times 10^{20}$ cm$^{-3}$ or greater and $6 \times 10^{21}$ cm$^{-3}$ or less. It is preferable that the impurity concentration of the contact region 201 is highest in the interface thereof contacting the first ohmic electrode 122. Nonetheless, this condition does not need to be always fulfilled, and it is sufficient that the part of the contact region 201 contacting the first ohmic electrode 122 has an impurity concentration of $6 \times 10^{20}$ cm$^{-3}$ or greater and $6 \times 10^{20}$ cm$^{-3}$ or less. It is preferable that the peak of the impurity profile in the first region 201a is also $6 \times 10^{20}$ cm$^{-3}$ or greater and $6 \times 10^{21}$ cm$^{-3}$ or less. In the case where there are a plurality of peaks in the first region 201a, it is preferable that the average of the peak values is $6 \times 10^{20}$ cm$^{-3}$ or greater and $6 \times 10^{21}$ cm$^{-3}$ or less.

In the production process of the semiconductor device 100 in this embodiment, the anneal step, the silicidation step and the etching step are performed after the contact region 201 is formed. Therefore, a surface portion of the contact region 201 is removed. The depth to which the contact region 201 will be removed is calculated in advance, and ion implantation of impurities is performed such that the impurity concentration peak is existent at about the same position as the depth to which the contact region 201 will be removed (estimated depth). Owing to this, the impurity concentration peak can be located at or in the vicinity of the interface of the contact region 201 contacting the first ohmic electrode 122 in a finished product of the semiconductor device in this embodiment.

In this embodiment, the impurity concentration of the part of the contact region 201 contacting the first ohmic electrode 122 is high. Therefore, the contact resistance to the body region 104 can be decreased.

Conventionally, in the case where a contact region is formed by multiple-stage ion implantation, ion implantation is performed under such conditions that a plurality of impurity concentration peaks in the contact region have an approximately equal value to each other.

As a result of studies conducted by the present inventors, it was revealed that when the impurity concentration of the part of the contact region 201 contacting the first ohmic electrode 122 (first region 201a) is high, the resistance between the body region 104 and the first ohmic electrode 122 does not become significantly high even if the impurity concentration of a region of the contact region 201 which is deeper than the first region 201a (second region 201b) is not made high. According to this embodiment, since the time required for ion implantation can be shortened by decreasing the impurity concentration of the second region 201b, the load on the ion implantation apparatus can be alleviated and also the productivity can be enhanced.

In addition, the present inventors found that the surface of the contact region 201 may retract by the anneal step, the silicidation step, the etching step or the like performed after the contact region 201 is formed by ion implantation. In this embodiment, in order to make high the impurity concentration of the part of the contact region 201 contacting the first ohmic electrode 122 even when such retraction occurs, the first region 201a is formed deeper than the depth to which the surface of the contact region 201 retracts. Owing to this, the impurity concentration of the part of the contact region 201 contacting the first ohmic electrode 122 can be made high with certainty, regardless of the amount of retraction of the surface of the contact region 201.

For example, it is preferable that the highest impurity concentration in the second region 201b (value of the impurity concentration peak) is $5 \times 10^{19}$ cm$^{-3}$ or greater and $6 \times 10^{20}$ cm$^{-3}$ or less. In the case where there are a plurality of peaks in the second regions 201b, it is preferable that the average of the peak values is $5 \times 10^{19}$ cm$^{-3}$ or greater and $6 \times 10^{20}$ cm$^{-3}$ or less. Owing to such a concentration of the second region 201b, the time required for ion implantation performed for forming the second region 201b can be shortened. Therefore, the load on the ion implantation apparatus can be alleviated.

It is more preferable that the peak value in the second region 201b is ⅕ or less of the peak value in the first region 201a. In this case, the contact resistance of the first region 201a to the body region 104 can be kept low, and the second region 201b can be formed in a short time. Therefore, the decrease of the contact resistance and the alleviation of the load on the ion implantation apparatus can be both realized effectively.

A region of the drift region 102 which is held between adjacent body regions 104 is referred to as a "JFET region 60". In the semiconductor device 100, an electric current is controlled in a path from the impurity region 103 provided in the body region 104 via the JFET region 60 to the rear surface 101b of the semiconductor substrate 101. Therefore, the semiconductor device 100 includes a gate insulating film 107 provided above the drift region 102 exposed at least at the top surface 120a of the impurity region 103 and the first epitaxial layer 120, namely, above a partial region 40 of the body region 104 located between the impurity region 103 and the JFET region 60. The semiconductor device 100 also includes a gate electrode 108 provided on the gate insulating film 107. The semiconductor device 100 performs the above-described current control by a voltage applied between the first ohmic electrode 122 and the gate electrode 108. In this step, as described above, the potential of the partial region 40 of the body region 140 can be matched to the potential of the first ohmic electrode 122 very quickly. Therefore, the semiconductor device 100 can be operated with no delay to the switching performed by a voltage applied between the first ohmic electrode 122 and the gate electrode 108.

For this reason, the semiconductor device 100 may include an accumulation type channel or an inversion type channel as long as the current control can be performed by a voltage applied between the first ohmic electrode 122 and the gate electrode 108. The semiconductor device 100 shown in FIG. 1A further includes a second epitaxial layer 105 containing silicon carbide, which is provided between the partial region 40 of the body region 104, which is located between the impurity region 103 and the JFET region 60, and the gate insulating film 107. The second epitaxial layer 105 acts as an accumulation type channel. In general, in order to activate implanted impurities, the impurities need to be annealed at a high temperature of 1000° C. or higher, preferably of 1600° C. or higher. However, during the annealing performed for activation, step bunching or the like occurs at a surface of silicon carbide, which decreases the carrier mobility. Owing to the formation of the second epitaxial layer 105, a smooth surface of silicon carbide with no step bunching can be provided.

In the case where the semiconductor device in this embodiment includes an inversion type channel, the second epitaxial layer 105 is not provided. In this case, the gate insulating film 107 is in direct contact with the partial region 40 of the body region 104 which is located between the impurity region 103 and the JFET region 60.

As shown in FIG. 1A, the second epitaxial layer 105 is electrically connected to each of the impurity region 103 and the partial region 40 of the body region 104.

An interlayer insulating layer 109 is provided so as to cover the top surface 120a of the first epitaxial layer 120, and a contact hole 109a for exposing the gate electrode 108 and a contact hole 109b for exposing the first ohmic electrode 122 are formed in the interlayer insulating layer 109.

In the contact hole 109a, a wiring line 112 is provided, and the wiring line 112 is in contact with, and is electrically connected to, the gate electrode 108. In this embodiment, a metal silicide layer 123 is provided between the wiring line 112 and the gate electrode 108. In the contact hole 109b, a wiring line 110 is provided. The wiring line 110 is in contact with, and is electrically connected to, the first ohmic electrode 122. On the rear surface 101b of the semiconductor substrate 101, a second ohmic electrode 111 is provided.

In the semiconductor device 100 in this embodiment, the contact region includes the first region 201a having a high impurity concentration and the second region 201b having a relatively low impurity concentration. Owing to this, the load on the ion implantation apparatus can be alleviated while the contact resistance of the first ohmic electrode 122 to the body region can be decreased. Thus, a semiconductor device which is superb in mass productivity is provided. In addition, the contact resistance can be made small. Therefore, the potential of the body region 104 can be matched to the potential of the first ohmic electrode 122 very quickly. This suppresses the delay of change of the potential of the body region 104, and thus can suppress the delay of the switching speed of the semiconductor device 100.

According to this embodiment, the first region 201a having a relatively high impurity concentration is provided. Owing to this, a sufficiently high carrier concentration can be provided even if the activation rate of the impurities is low. Therefore, the annealing temperature for activating the impurities can be made low. As a result, the possibility that the wafer is warped can be decreased.

The semiconductor device 100 in this embodiment is, for example, a power semiconductor device formed of an SiC semiconductor, and is preferably usable for a high-withstand voltage, large-current and high-speed operation. Hereinafter, a specific example of the structure shown in FIG. 1A will be described. In one example of this embodiment, the first conductivity type is n type, and the second conductivity type is p type. In this case, the first ohmic electrode 122 is a source electrode, and the second ohmic electrode 111 is a drain electrode. The impurity region 103 is a source region. In the following example, the impurity concentration fulfills the relationship of ++>+>−.

The semiconductor substrate 101 is formed of hexagonal silicon carbide. The semiconductor substrate 101 has a thickness of, for example, 250 μm or greater and 350 μm or less, and has an impurity concentration of, for example, $8 \times 10^{18}$ cm$^{-3}$ (n$^+$). In the case where the impurity concentration is set low, a substrate formed of cubic silicon carbide may be used as the semiconductor substrate 101.

The first epitaxial layer 120 is an SiC layer formed by epitaxial growth on the main surface 101a of the semiconductor substrate 101. The first epitaxial layer 120 has a thickness of, for example, 4 μm to 15 μm, and an impurity concentration of, for example, $5 \times 10^{15}$ cm$^{-3}$ (n$^-$). Another epitaxial layer (e.g., an SiC layer having a concentration of $6 \times 10^{16}$ cm$^{-3}$) may be formed between the semiconductor substrate 101 and the first epitaxial layer 120.

The body region 104 has a thickness (i.e., depth from the top surface 120a) of, for example, 0.5 μm or greater and 1.0 μm or less, and an impurity concentration of, for example, $1.5 \times 10^{18}$ cm$^{-3}$ (p$^-$). The impurity region 103 has a thickness (i.e., depth from the top surface 120a) of, for example, 0.25 μm, and an impurity concentration of, for example, $5 \times 10^{19}$ cm$^{-3}$ (n$^{++}$).

In this embodiment, an interface of the body region 104 contacting the first ohmic electrode 122 has an impurity concentration of, for example, $2 \times 10^{20}$ cm$^{-3}$ (p$^-$). The JFET region 60 has a length (width) of, for example, 3 μm.

The second epitaxial layer 105 is an SiC layer formed by epitaxial growth on the first epitaxial layer 120, and has a thickness of, for example, 30 nm or greater and 150 nm or less. The partial region 40 of the body region 104 has a length (width) of, for example, 0.5 μm.

The gate insulating film 107 is formed of, for example, SiO$_2$ (silicon oxide) and has a thickness of, for example, 70 nm. The gate electrode 108 is formed of, for example, poly-Si (polycrystalline silicon) and has a thickness of, for example, 500 nm. The first ohmic electrode 122 is formed of, for example, an alloy of Ni (nickel) and Si (silicon) and has a thickness of, for example, 70 nm. The first ohmic electrode 122 may be formed of an alloy of Ti (titanium) and Si (silicon). The second ohmic electrode 111 is also formed of, example, an alloy of Ti (titanium) and Si (silicon) or an alloy of Ni (nickel) and Si (silicon), and has a thickness of, for example, 100 nm. On the second ohmic electrode 111, Ni and Ag, or Ni and Au, may be deposited in order to facilitate soldering performed for mounting the semiconductor device 100 on a plastic package.

FIG. 4 is a graph schematically showing impurity profiles in the first region 201*a*, the second region 201*b* and the body region 104. In FIG. 4, the first region 201*a*, the second region 201*b* and the body region 104 are formed by multiple-stage ion implantation. Therefore, the impurity concentration (dashed line) in each region 201*a* is almost uniform. At the border between the first region 201*a* and the second region 201*b* (bottom surface of the first region 201*a*) and at the border between the second region 201*b* and the body region 104 (bottom surface of the second region 201*b*), the impurity concentration in the depth direction is changed more steeply than at other depths.

Now, with reference to FIG. 5A through FIG. 9B, a method for producing the semiconductor device 100 in this embodiment will be described. FIG. 5A through FIG. 9B are schematic cross-sectional views showing the steps of the production method in this embodiment.

First, in order to obtain the structure shown in FIG. 5A, the following steps are performed. As the semiconductor substrate 101, an n-type 4H-SiC (0001) substrate is prepared. This substrate is, for example, off-cut at 8° or 4° in the <11-20> direction and has an n-type impurity concentration of, for example, $1 \times 10^{18}$ cm$^{-3}$ or greater and $1 \times 10^{18}$ cm$^{-3}$ or less.

Next, on the main surface 101*a* of the semiconductor substrate 101, the first epitaxial layer 120 is formed by epitaxial growth. The first epitaxial layer 120 is epitaxially grown by, for example, thermal CVD using silane (SiH$_4$) and propane (C$_3$H$_8$) as a material gas, hydrogen (H$_2$) as a carrier gas, and nitrogen (N$_2$) gas as a dopant gas. The first epitaxial layer 120 has a thickness of 10 µm or greater and an impurity concentration of $1 \times 10^{15}$ cm$^{-3}$ to $1 \times 10^{16}$ cm$^{-3}$.

Next, on the main surface 120*a* of the first epitaxial layer 120, an implantation mask material (not shown) is deposited, and a photoresist (not shown) is formed on the implantation mask material. The implantation mask material is, for example, SiO$_2$ (silicon oxide). Silicon oxide as the implantation mask material is deposited by, for example, plasma CVD at a power of 200 W using silane (SiH$_4$) and N$_2$O gas. The implantation mask material has a thickness of, for example, 0.5 µm or greater and 1.0 µm or less. The photoresist (not shown) is located at such a position and has such a size that define the body region 104 and the JFET region 60. The photoresist is, for example, a photosensitive organic film and is formed by typical photolithography. The photoresist has a thickness of, for example, 1.5 µm or greater and 2.0 µm or less. Anisotropic etching is performed on the implantation mask material using the photoresist as a mask, and thus an implantation mask pattern 72 is formed. Then, the photoresist is removed. The etching on the implantation mask material is performed by, for example, anisotropic dry etching using CF$_4$ gas and CHF$_3$ gas. The photoresist is removed by, for example, ashing by use of oxygen plasma. Hereinafter, unless otherwise specified, implantation masks performed for ion implantation are formed by substantially the same method as described above.

Next, Al$^+$ ion 80 is implanted into the first epitaxial layer 120 using the implantation mask pattern 72 as a mask, and thus the body region 104 having a prescribed depth is formed in the vicinity of the top surface 120*a* of the first epitaxial layer 120. The ion implantation is performed, for example, a plurality of times at different energy levels in the range of 30 keV to 350 keV while the temperature of the substrate is kept at 500° C. The depth of the body region 104 is, for example, 0.5 µm or greater and 1.0 µm or less. A region which is in the vicinity of the top surface 120*a* of the first epitaxial layer 120 and held between the body regions 104 is the JFET region 60. The JFET region 60 in this embodiment has a width of, for example, 3 µm. The remaining region of the first epitaxial layer 120 in which the body region 104 is not formed is the drift region 102. By the above-described steps, the structure shown in FIG. 5A is obtained.

Next, as shown in FIG. 5B, an implantation mask material is deposited on the main surface 120*a* of the first epitaxial layer 120 so as to cover the implantation mask pattern 72. For example, the implantation mask material is poly-Si (polycrystalline silicon) and is formed by thermal CVD using SiH$_4$ as a material gas. A photoresist (not shown) having a prescribed pattern is formed on the implantation mask material, and then anisotropic etching is performed on the implantation mask material. Thus, implantation mask patterns 71*a* and 71*b* are formed. The implantation mask pattern 71*b* shown in the figure is located below the photoresist and is provided so as not to introduce impurities into a region where the contact region 201 is to be formed. The implantation mask pattern 71*a* is a side wall of the implantation mask pattern 72, and defines the width (length) of the channel. The gas usable for the anisotropic etching is mixed gas of, for example, Cl$_2$, O$_2$, HBr and the like.

Next, N$^+$ ion (nitrogen ion) or P$^+$ ion (phosphorus ion) 82 is implanted toward the top surface 120*a* of the first epitaxial layer 120 using the implantation mask patterns 72, 71*a* and 71*b* as masks, and thus the impurity region 103 is formed. The ion implantation is performed, for example, a plurality of times at different energy levels in the range of 30 keV to 90 keV while the temperature of the substrate 101 is kept at 500° C. The depth of the impurity region 103 is, for example, 0.25 µm.

Next, as shown in FIG. 5C, the implantation mask patterns 71*a*, 71*b* and 72 are removed. The implantation mask patterns 71*a* and 71*b* are formed of, for example, an oxide film and thus are removed by an aqueous solution of HF. The implantation mask pattern 72 is formed of polycrystalline silicon and thus is removed by a mixed solution of HF, HNO$_3$ and H$_2$O. Then, an implantation mask patter 73 is formed.

Next, as shown in FIG. 6A, Al$^+$ ion (aluminum ion) or B$^+$ ion (boron ion) 84 is implanted into the body region 104 using the implantation mask pattern 73 as a mask, and thus the contact region 201 is formed. The ion implantation is performed at each of the energy levels of 30 keV, 70 keV and 150 keV while the temperature of the substrate 101 is kept at 500° C.

In this step, for example, the first region 201*a* is formed by the implantation at the energy levels of 30 keV and 70 keV, and the second region 201*b* is formed by the implantation at the energy level of 150 keV.

For example, the ion implantation at the energy level of 30 keV is performed at $3.3 \times 10^{15}$ cm$^{-2}$, and the ion implantation at the energy level of 70 keV is performed at $7.2 \times 10^{15}$ cm$^{-2}$. In this case, the first region 201*a* is formed to a depth of, for example, about 70 nm from the surface thereof. In the first region 201*a*, there are impurity concentration peaks of a number which is the same as the number of times the ion implantation is performed at the energy levels of 30 keV and 70 keV. The impurity concentration peaks have a concentration of $6 \times 10^{20}$ cm$^{-3}$ or greater and $6 \times 10^{21}$ cm$^{-3}$ or less. The first region 201*a* has a thickness of, for example, 70 nm or greater and 100 nm or less.

The conditions of the ion implantation performed to form the first region 201a are not limited to the above-described conditions. Nonetheless, in this embodiment, it is preferable that at least once, the ion implantation for forming the first region 201a is performed under the conditions of an energy level of 70 keV or greater and 100 keV or less and a dose of $3.6 \times 10^{15}$ cm$^{-2}$ or greater and $6 \times 10^{16}$ cm$^{-2}$ or less. More preferably, the ion implantation is performed at a dose of $7.2 \times 10^{15}$ cm$^{-2}$ or greater. When the ion implantation is performed while such conditions are fulfilled, even if the surface of the contact region 201 retracts during the production process, the impurity concentration at the surface of the contact region 201 can be in the range of $6 \times 10^{20}$ cm$^{-3}$ or greater and $6 \times 10^{21}$ cm$^{-3}$ or less in a finished product of the semiconductor device.

Meanwhile, the second region 201b of the contact region 201 is formed by the ion implantation performed at the energy level of 150 keV. For example, the ion implantation at the energy level of 150 keV is performed at $8 \times 10^{16}$ cm$^{-2}$. It is preferable that the impurity concentration peak in the second region 201b is lower than the impurity concentration peak in the first region 201a. Specifically, the average of the peak values of the impurities in the second region 201b is $5 \times 10^{19}$ cm$^{-3}$ or greater and $1 \times 10^{20}$ cm$^{-3}$ or less.

The conditions of the ion implantation performed to form the second region 201b are not limited to the above-described conditions. Nonetheless, in this embodiment, it is preferable that at least once, the ion implantation for forming the second region 201b is performed under the conditions of an energy level of 150 keV or greater and 200 keV or less and a dose of $2.8 \times 10^{15}$ cm$^{-2}$ or greater and $1 \times 10^{16}$ cm$^{-2}$ or less. When the ion implantation is performed while such conditions are fulfilled, the time required for ion implantation can be shortened as compared with the conventional art. In addition, the depth required for the contact region 201 can be obtained with certainty. In the step shown in FIG. 5A, the ion implantation for forming the body region 104 is performed a plurality of times at different energy levels in the range of 30 keV to 150 keV. The ion implantation for forming the second region 201b is typically performed at an energy level lower than the maximum energy level of the ion implantation for forming the body region 104. Owing to this, the impurity concentration peak in the second region 201b is located at a position shallower than the impurity concentration peak located at the deepest position in the body region 104.

Figure 9A:
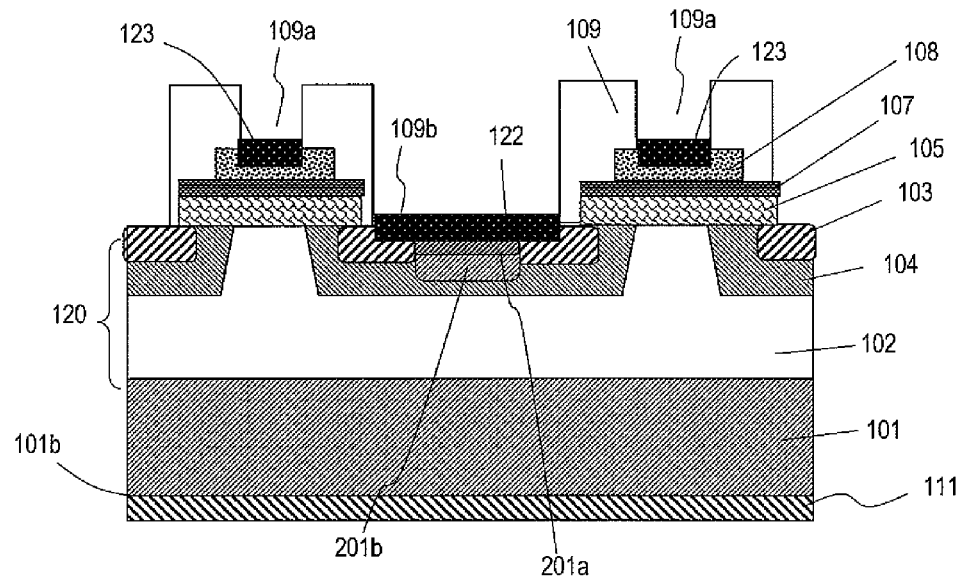
FIG. 9A is a cross-sectional view showing a production step of the semiconductor device shown in FIG. 1A.

It is preferable that the depth of the first region 201a of the contact region 201 is determined such that the impurity concentration is highest at the interface of the first region 201a contacting the first ohmic electrode 122 to be formed later. The first ohmic electrode 122 is formed by a metal and silicon carbide being alloyed. In this step, silicon carbide of a thickness approximately equal to that of the metal is alloyed (FIG. 9A). There is an undesirable possibility that as a result of the alloying, the surface of the contact region 201 may retract by a thickness approximately equal to that of the metal used for forming the first ohmic electrode 122. For example, in the case where the metal used for forming the first ohmic electrode 122 has a thickness of 35 nm, the surface of the contact region 201 may undesirably retract by about 35 nm as a result of the alloying. In this case, the first ohmic electrode 122 having a thickness of about 70 nm is formed.

Si at the surface of the contact region 201 may vanish as a result of the alloying (silicidation) and also as a result of annealing performed at a high temperature in a later step. As a result of etching performed in a later step (FIG. 6C and FIG. 8A), the surface of the contact region 201 may undesirably retract. In the case where the surface of the contact region 201 retracts, the retraction can occur to a depth of 50 nm at the maximum. It is preferable that the depth of the first region 201a of the contact region 201 is greater than the maximum depth to which the contact region 201 may be undesirably removed.

Next, the implantation mask pattern 73 is removed, and then the semiconductor substrate 101 (more accurately, each layer (each region of the first epitaxial layer 120)) is annealed for activation at a temperature of 1000° C. or higher (in this example, at a temperature of 1800° C.) (this step is not shown).

Next, as shown in FIG. 6B, the second epitaxial layer 105 is formed. In this embodiment, the second epitaxial layer 105 is formed of SiC. The second epitaxial layer 105 is formed by, for example, thermal CVD using silane (SiH$_4$ and propane (C$_3$H$_8$) as a material gas, hydrogen (H$_2$) as a carrier gas, and nitrogen (N$_2$) gas as a dopant gas. The second epitaxial layer 105 has an impurity concentration of, for example, $1 \times 10^{15}$ cm$^{-3}$ or greater and $5 \times 10^{15}$ cm$^{-3}$ or less, and a thickness of 30 nm or greater and 150 nm or less. During the growth of the second epitaxial layer 105, nitrogen (N$_2$) gas may be introduced to make a part of the second epitaxial layer 105 have a high concentration.

Next, as shown in FIG. 6C, a photoresist 75 is formed on the second epitaxial layer 105, and then the second epitaxial layer 105 is etched using the photoresist 75 as a mask. The etching performed on the second epitaxial layer 105 is, for example, dry etching using mixed gas of CF$_4$ and O$_2$.

Figure 7A:
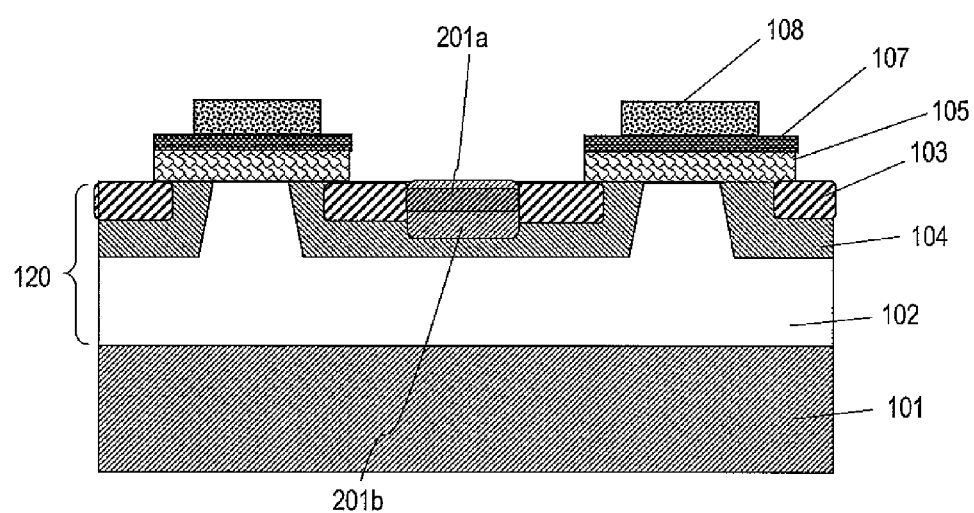
FIG. 7A is a cross-sectional view showing a production step of the semiconductor device shown in FIG. 1A.

Next, as shown in FIG. 7A, the photoresist 75 is removed, and then the gate insulating film (SiO$_2$) 107 is formed on the second epitaxial layer 105. Next, the gate electrode (poly-Si) 108 is formed on the gate insulating film 107. Then, a photoresist (not shown) is formed on the gate electrode 108, the gate electrode 108 is etched, and the photoresist is removed.

Figure 7B:
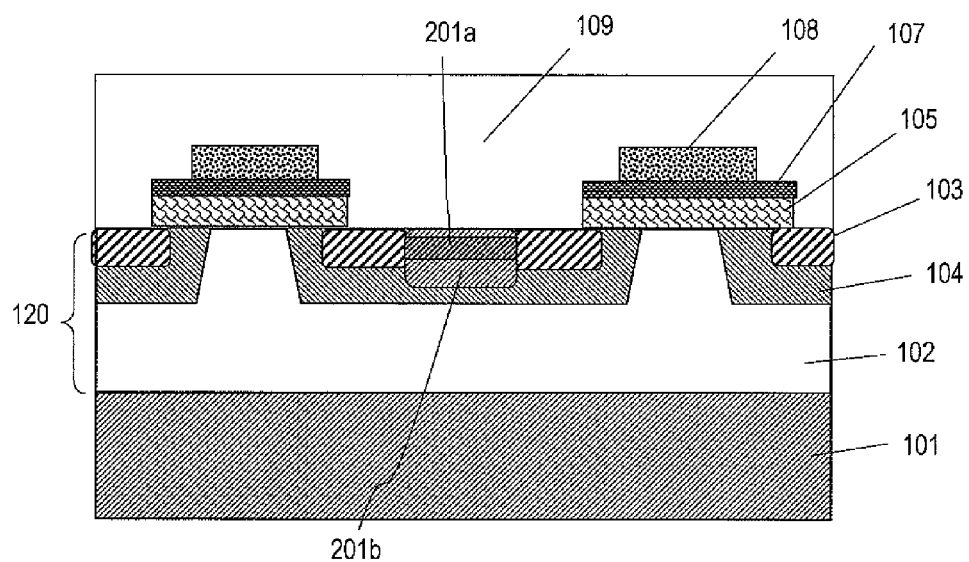
FIG. 7B is a cross-sectional view showing a production step of the semiconductor device shown in FIG. 1A.

Next, as shown in FIG. 7B, the interlayer insulating film 109 is formed on the first epitaxial layer 120 so as to cover the gate electrode 108 and the second epitaxial layer 105. The interlayer insulating film 109 is formed of, for example, silicon oxide (SiO$_2$) and has a thickness of, for example, 1000 nm.

Figure 8A:
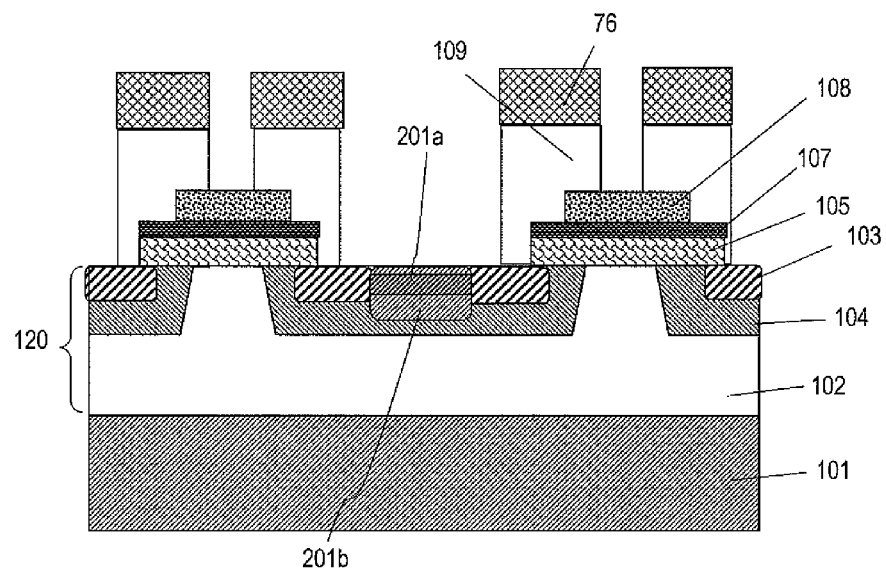
FIG. 8A is a cross-sectional view showing a production step of the semiconductor device shown in FIG. 1A.

Next, as shown in FIG. 8A, the interlayer insulating film 109 is etched using a photoresist 76 as a mask. The etching performed on the interlayer insulating film 109 is, for example, dry etching using mixed gas of CHF$_3$ and O$_2$.

Figure 8B:
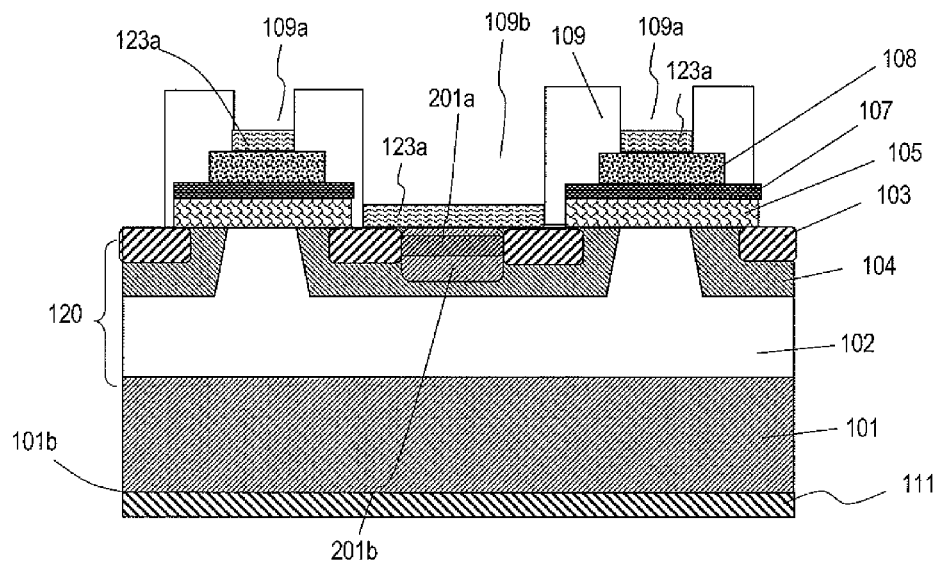
FIG. 8B is a cross-sectional view showing a production step of the semiconductor device shown in FIG. 1A.

Next, as shown in FIG. 8B, the photoresist 76 is removed, and then a contact metal (titanium (Ti) or nickel (Ni)) 123a is deposited in the contact hole 109a and the contact hole 109b.

Next, as shown in FIG. 9A, the contact metal 123a is heat-treated to perform silicidation. Next, an unreacted part of the contact metal is removed, and thus the first ohmic electrode 122 is formed in the contact hole 109b and also the metal silicide layer 123 is formed on the gate electrode 108 in the contact hole 109a. The first ohmic electrode 122 is in contact with the impurity region 103 and the body region 104. In this step, the contact region 201 provided in the body region 104 is alloyed with the contact metal and thus becomes the first ohmic electrode 122. The entirety of the contact region 201 may be alloyed with the contact metal or a part of the contact region 201 may be left unalloyed. In the case where, for example, the contact metal is Ti, Ti is deposited and then heat treatment is performed at 950° C.

Metal is deposited on the rear surface 101b of the semiconductor substrate 101 and heat-treated, and thus the second ohmic electrode 111 is formed. The second ohmic electrode 111 is formed by, for example, depositing Ti and then performing heat treatment at 950° C.

Figure 9B:
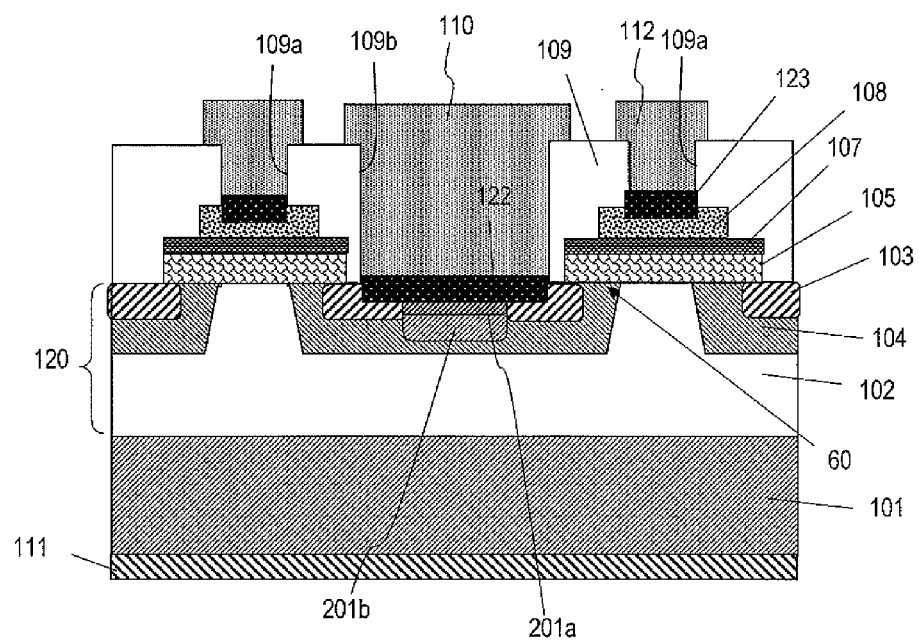
FIG. 9B is a cross-sectional view showing a production step of the semiconductor device shown in FIG. 1A.

In a final step, as shown in FIG. 9B, the wiring lines 112 and 110 are formed respectively in the contact holes 109a and 109b so as to respectively contact the metal silicide layer 123 and the first ohmic electrode 122. Thus, the semiconductor device 100 is completed.

Figure 10:
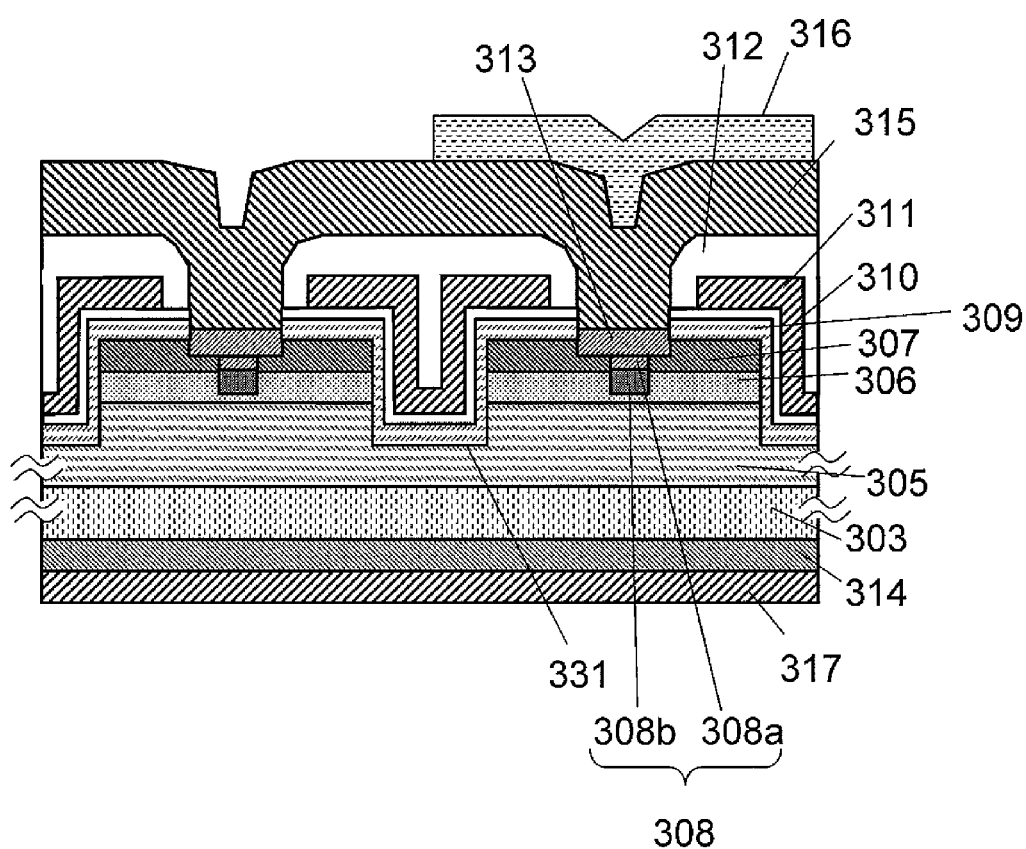
FIG. 10 is a cross-sectional view showing a structure of a trench type MISFET in an embodiment.
Figure 11:
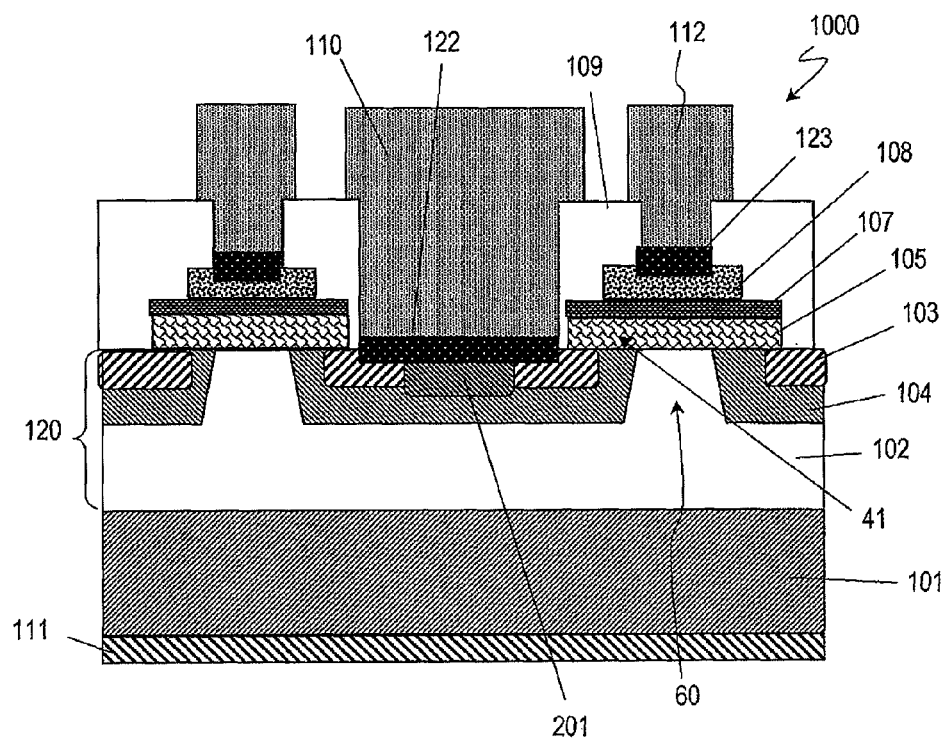
FIG. 11 is a cross-sectional view schematically showing a conventional semiconductor device.
Figure 12A:
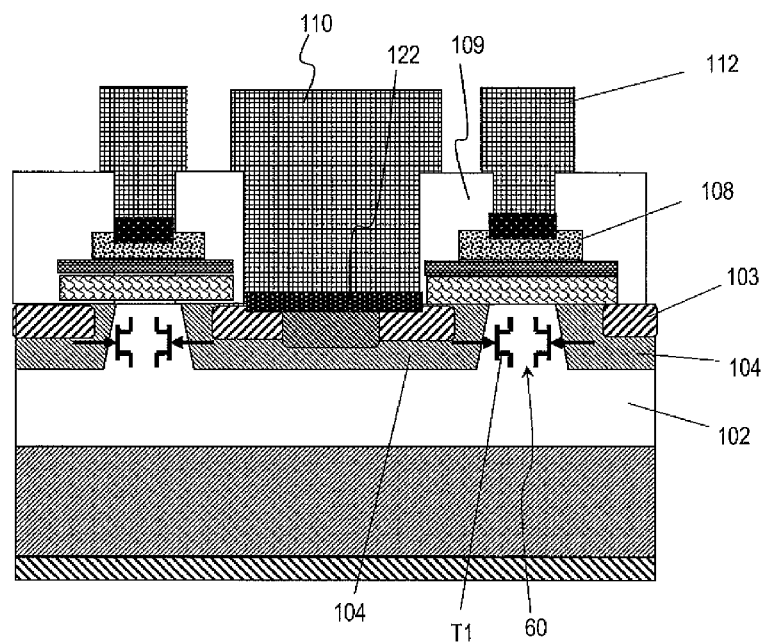
FIG. 12A schematically shows an equivalent circuit generated when the conventional semiconductor device is put into an ON state.
Figure 12B:
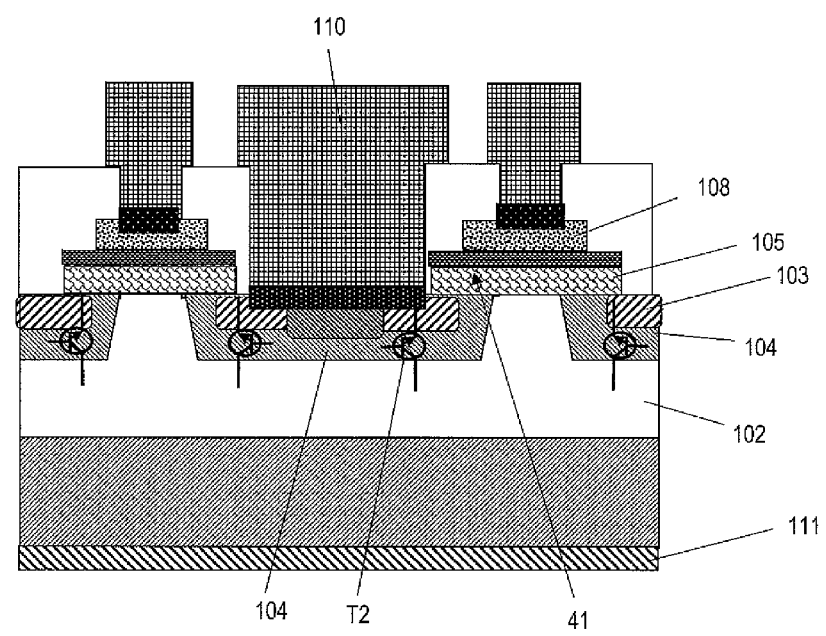
FIG. 12B schematically shows an equivalent circuit generated when the conventional semiconductor device is put into an OFF state.

The present invention is also applicable to a trench type MISFET. FIG. 10 is a cross-sectional view showing a structure of a trench type MISFET in this embodiment. As shown in FIG. 10, the trench type MISFET in this embodiment includes a silicon carbide substrate 303 of the first conductivity type and a drift layer 305 provided on a main surface of the silicon carbide substrate 303. Between the silicon carbide substrate 303 and the drift layer 305, a silicon carbide buffer layer having an impurity concentration of a value which is between the impurity concentration values of the silicon carbide substrate 303 and the drift layer 305 may be provided.

In a surface portion of the drift layer 305, a body region 306 of the second conductivity type is provided. An impurity region 307 of the first conductivity type and a contact region 308 of the second conductivity type are located in contact with the body region 306. The contact region 308 includes a first region 308a and a second region 308b, and have impurity profiles substantially the same as those shown in FIG. 2.

In a process for producing the trench type MISFET also, a surface of the contact region 308 may retract. Specifically, the surface of the contact region 308 may retract by the contact etching step, the anneal step, the silicidation step, or the like. The depth of retraction is, for example, 70 nm in total. In a step of forming the contact region 308, it is preferable that the first region 308a is set to be formed to a depth of 50 nm or greater.

The body region 306 and the impurity region 307 are partitioned into a plurality of areas by a trench 331. The trench 331 is provided so as to run through the body region 306 and the impurity region 307, and a bottom surface of the trench 331 is located in the drift layer 305.

A first ohmic electrode 313 is provided on the contact region 308 and the impurity region 307 provided around the contact region 308. The first ohmic electrode 313 is, for example, an alloy layer of nickel, silicon and carbon or an alloy layer of titanium, silicon and carbon.

A channel epitaxial layer 309 formed of silicon carbide is provided on the impurity region 307 around the first ohmic electrode 313 and on a surface of the trench 331. A part of the channel epitaxial layer 309 which is in contact with the body region 306 acts as a channel of the MISFET. On the channel epitaxial layer 309, a gate insulating film 310 formed of, for example, a silicon oxide film is provided. On the gate insulating film 310, a gate electrode 311 formed of, for example, polycrystalline silicon is provided. On the gate electrode 311 and the gate insulating film 310, an interlayer insulating film 312 formed of, for example, silicon oxide is provided.

On the first ohmic electrode 313 and the interlayer insulating film 312, a pad electrode 315 formed of, for example, aluminum or an alloy thereof is provided. On the pad electrode 315, a protective insulating film 316 formed of an insulating material containing a nitride of silicon is provided.

On a rear surface of the silicon carbide substrate 303, a rear electrode 317 is provided. The rear electrode 317 has a stacking structure including titanium, nickel and silver sequentially from the side of the silicon carbide substrate 303. Between the rear electrode 317 and the rear surface of the silicon carbide substrate 303, a drain electrode 314 is provided. The drain electrode 314 is, for example, an alloy layer of nickel, silicon and carbon or an alloy layer of titanium, silicon and carbon, like the first ohmic electrode 313. In the trench type MISFET also, the channel epitaxial layer 309 is not absolutely necessary.

So far, the present invention has been described by way of preferable embodiments. The present invention is not limited to the above-described embodiments, and may be modified in various manners. Especially, in the above embodiments, the semiconductor device has a MISFET structure. Alternatively, the semiconductor device may have an insulating gate bipolar transistor (IGBT) structure. In this case, the impurity region is an emitter or a collector, the first ohmic electrode is an emitter electrode or a collector electrode, and the second ohmic electrode is a collector electrode or an emitter electrode.

INDUSTRIAL APPLICABILITY

The present invention is applicable to various types of semiconductor devices using silicon carbide, and is especially preferably usable for a power semiconductor device operable at high speed.

REFERENCE SIGNS LIST

40 Partial region
41 Accumulation type channel
60 JFET region
71a, 71b, 72, 73 Implantation mask pattern
75, 76 Photoresist
80 $A^+$ ion
82 $N^+$ ion or $P^+$ ion
84 $Al^+$ ion or $B^+$ ion
100, 1000 Semiconductor device
101 Semiconductor substrate
101a Main surface
101b Rear surface
102 Drift region
103 Impurity region
104 Body region
105 Second epitaxial layer
107 Gate insulating film (gate oxide film)
108 Gate electrode
109 Interlayer insulating film
109a, 109b Contact hole
110 Wiring line
111 Second ohmic electrode
112 Wiring line
120 First epitaxial region
120a Top surface
121 Trench
122 First ohmic electrode
123 Metal silicide layer
123a Contact metal
201 Contact region
201a First region
201b Second region
303 Silicon carbide substrate
304 Buffer layer
305 Drift layer
306 Body region
307 Impurity region
308 Contact region
308a First region
308b Second region
309 Channel epitaxial layer
310 Gate insulating film
311 Gate electrode
312 Interlayer insulating film 313 First ohmic electrode
314 Drain electrode
315 Pad electrode
316 Protective insulating film
317 Rear electrode
331 Trench

The invention claimed is:

1. A semiconductor device, comprising:
- a semiconductor substrate of a first conductivity type which has a main surface and a rear surface and contains silicon carbide;
- a first epitaxial layer of the first conductivity type which is provided on the main surface of the semiconductor substrate and contains silicon carbide;
- a body region of a second conductivity type which is provided in the first epitaxial layer;
- an impurity region of the first conductivity type which is provided in contact with the body region;
- a contact region of the second conductivity type which is provided in the body region;
- a first ohmic electrode in contact with the contact region;
- a gate insulating film provided above at least a part of the body region; and
- a gate electrode provided on the gate insulating film;

wherein:
- the contact region includes a first region in contact with the first ohmic electrode and a second region located at a position deeper than that of the first region and in contact with the body region;
- the first region and the second region each have at least one peak of impurity concentration in a depth direction;
- the at least one peak of impurity concentration in the first region has a higher value than that of the at least one peak of impurity concentration in the second region;
- a bottom surface of the second region is deeper than a bottom surface of the impurity region and is shallower than a bottom surface of the body region; and
- the first ohmic electrode is formed of an alloy of a metal and silicon carbide.

2. The semiconductor device of claim 1, wherein the value of the at least one peak in the first region is $6 \times 10^{20}$ cm$^{-3}$ or greater and $2 \times 10^{21}$ cm$^{-3}$ or less.

3. The semiconductor device of claim 1, wherein the value of the at least one peak in the second region is $5 \times 10^{19}$ cm$^{-3}$ or greater and $2 \times 10^{21}$ cm$^{-3}$ or less.

4. The semiconductor device of claim 1, wherein the value of the at least one peak in the second region is 1/5 or less of the value of the at least one peak in the first region.

5. The semiconductor device of claim 1, wherein the impurity concentration of the second conductivity type in the contact region is highest at an interface thereof contacting the first ohmic electrode.

6. The semiconductor device of claim 1, wherein:
- a region of the first epitaxial layer other than the body region is a drift region; and
- the gate insulating film is provided above at least a part of a region, of the body region, which is located between the impurity region and the drift region.

7. The semiconductor device of claim 6, further comprising a second epitaxial layer containing silicon carbide and provided between the gate insulating film and at least the part of the region, of the body region, which is located between the impurity region and the drift region.

8. The semiconductor device of claim 6, wherein at least the part of the region, of the body region, which is located between the impurity region and the drift region is in contact with the gate insulating film.

9. The semiconductor device of claim 1, wherein the first ohmic electrode contains nickel silicide or titanium silicide.

10. The semiconductor device of claim 1, wherein the impurity region surrounds the contact region at an arbitrary depth in the body region.

11. A method for producing a semiconductor device, comprising:
- step (a) of using a semiconductor substrate of a first conductivity type which has a main surface and a rear surface and contains silicon carbide, thereby forming a first epitaxial layer of the first conductivity type which contains silicon carbide on a main surface of the semiconductor substrate;
- step (b) of forming a body region of a second conductivity type in the first epitaxial layer;
- step (c) of forming an impurity region of the first conductivity type in contact with the body region;
- step (d) of forming a contact region of the second conductivity type in the body region;
- step (e) of forming a first ohmic electrode on a main surface of the impurity region;
- step (f) of forming a gate insulating film above at least a part of the body region;
- step (g) of forming a gate electrode on the gate insulating film; and
- step (h) of forming a second ohmic electrode on the rear surface of the semiconductor substrate;

wherein:
- the step (d) includes step (d1) of performing ion implantation at least once, thereby forming a first region, and step (d2) of performing ion implantation at least once at a higher energy level than the ion implantation performed in the step (d1), thereby forming a second region;
- the first region and the second region each have at least one peak of impurity concentration in a depth direction;
- the at least one peak of impurity concentration in the first region has a higher value than that of the at least one peak of impurity concentration in the second region;
- the second region is in contact with the body region, and a bottom surface of the second region is deeper than a bottom surface of the impurity region and is shallower than a bottom surface of the body region;
- in the step (e), the first ohmic electrode is formed so as to be in contact with the first region; and
- the first ohmic electrode is formed of an alloy of a metal and silicon carbide.

12. The method for producing a semiconductor device of claim 11, wherein in the step (d1), the ion implantation is performed at least once under conditions of 70 keV or greater and 100 keV or less and $3.6 \times 10^{15}$ cm$^{-2}$ or greater and $6 \times 10^{16}$ cm$^{-2}$ or less.

13. The method for producing a semiconductor device of claim 12, wherein in the step (d1), the ion implantation is performed at least once under a condition of $7.2 \times 10^{15}$ cm$^{-2}$ or greater.

14. The method for producing a semiconductor device of claim 11, wherein in the step (d2), the ion implantation is performed at least once under conditions of 150 keV or greater and 200 keV or less and $2.8 \times 10^{15}$ cm$^{-2}$ or greater and $5 \times 10^{16}$ cm$^{-2}$ or less.

15. The method for producing a semiconductor device of claim 11, wherein the step (d) further includes step (i) of annealing the semiconductor substrate for activating ion-implanted impurities;
wherein in the step (d1), the at least one peak of impurity concentration in the first region is formed at a position which is deeper than a depth to which a surface of the contact region is to retract in the step (e) and the step (i).

* * * * *